(12) United States Patent
Dadkhah et al.

(10) Patent No.: US 7,679,805 B2
(45) Date of Patent: Mar. 16, 2010

(54) FLIP CHIP QUANTUM WELL MODULATOR

(75) Inventors: Mahyar Dadkhah, San Diego, CA (US);
Tony Maryfield, Poway, CA (US);
Thomas Davidson, Santee, CA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 12/171,803

(22) Filed: Jul. 11, 2008

(65) Prior Publication Data

US 2009/0034049 A1  Feb. 5, 2009

Related U.S. Application Data (60) Provisional application No. 60/949,229, filed on Jul. 11, 2007, provisional application No. 60/949,230, filed on Jul. 11, 2007, provisional application No. 60/949,200, filed on Jul. 11, 2007.

(51) Int. Cl.
*G02F 1/03* (2006.01)
*G02F 1/00* (2006.01)
*H01S 3/10* (2006.01)
*H01S 3/04* (2006.01)
*H01L 31/00* (2006.01)

(52) U.S. Cl. .................. 359/248; 359/245; 359/240; 359/237; 359/321; 359/885; 372/22; 372/43.01; 372/49.01; 257/21; 257/22

(58) Field of Classification Search .......... 359/240, 359/241, 245, 248, 249, 254, 276, 315, 321, 359/885; 257/14, 80, 184, 290, 291, 432, 257/433, E29.069, E31.033, 21, 91–94; 372/26, 372/45.011, 21, 22, 45, 46, 49, 50, 91–94, 372/98, 99; 398/118, 182, 183; 438/22, 438/46

See application file for complete search history.

(56) References Cited

U.S. PATENT DOCUMENTS 4,716,449 A * 12/1987 Miller .................. 257/21
5,136,602 A * 8/1992 Sugawara ............. 372/45.011

(Continued)

FOREIGN PATENT DOCUMENTS

| GB | 2366872 A | 3/2002 |
|----|-----------|--------|
| JP | 04263475 A | 9/1992 |
| JP | 2000/299489 A | 10/2000 |
| WO | WO 03075493 A | 9/2003 |

OTHER PUBLICATIONS

PCT International Search Report and Written Opinion mailed Nov. 13, 2008, International Application No. PCT/US2008/069888, 14 pages.
PCT International Search Report and Written Opinion mailed Feb. 13, 2009; International Application No. PCT/US2008/069875, 21 pages.
PCT International Search Report and Written Opinion mailed Oct. 10, 2008, Application No. PCT/US2008/069874, 15 pages.

*Primary Examiner*—Loha Ben
(74) *Attorney, Agent, or Firm*—Townsend and Townsend and Crew LLP (57) ABSTRACT

A quantum well modulator configured to absorb or transmit light depending on an applied voltage is provided according to various embodiments. The quantum well modulator may include a substrate, a p-type and n-type semiconductor layers as well as a quantum well layer, each of which are deposited above the substrate. The substrate may be configured to filter light incident thereon, wherein the substrate does not include a reflective surface. The flip-chip quantum well modulator may be configured to substantially absorb light received through the substrate when a first voltage is applied. The flip-chip quantum well modulator may be configured to substantially transmit light received through the substrate when a second voltage is applied.

15 Claims, 5 Drawing Sheets

U.S. PATENT DOCUMENTS

| | | | |
|---|---|---|---|
| 5,144,397 A * | 9/1992 | Tokuda et al. | 257/656 |
| 5,306,925 A * | 4/1994 | Abe et al. | 257/21 |
| 5,668,386 A | 9/1997 | Makiuchi et al. | |
| 5,912,475 A * | 6/1999 | Itagaki et al. | 257/94 |
| 6,005,276 A | 12/1999 | Forrest et al. | |
| 6,055,087 A * | 4/2000 | Kwon et al. | 359/248 |
| 6,154,299 A | 11/2000 | Gilbreath et al. | |
| 6,229,165 B1 | 5/2001 | Sakai et al. | |
| 6,278,136 B1 * | 8/2001 | Nitta | 257/99 |
| 6,438,150 B1 * | 8/2002 | Yoo | 372/49.01 |
| 6,646,292 B2 * | 11/2003 | Steigerwald et al. | 257/103 |
| 6,687,268 B2 * | 2/2004 | Kitamura et al. | 372/22 |
| 6,803,604 B2 * | 10/2004 | Takahashi et al. | 257/80 |
| 6,836,351 B2 * | 12/2004 | Livingston et al. | 359/279 |
| 7,213,942 B2 * | 5/2007 | Jiang et al. | 362/231 |
| 7,333,735 B1 * | 2/2008 | Goorjian | 398/182 |
| 7,522,648 B2 * | 4/2009 | Park et al. | 372/50.1 |
| 2006/0054899 A1 * | 3/2006 | Takahashi et al. | 257/80 |
| 2006/0180830 A1 | 8/2006 | Alavi et al. | |
| 2007/0127928 A1 | 6/2007 | Varshneya et al. | |
| 2008/0217602 A1 * | 9/2008 | Kahen | 257/13 |

* cited by examiner

FLIP CHIP QUANTUM WELL MODULATOR

CROSS-REFERENCES TO RELATED APPLICATIONS

This application is a non-provisional, and claims the benefit, of commonly assigned U.S. Provisional Patent Application No. 60/949,229, filed Jul. 11, 2007, entitled "Flip Chip Quantum Well Modulator," the entirety of which is herein incorporated by reference for all purposes.

This application is a non-provisional, and claims the benefit, of commonly assigned U.S. Provisional Patent Application No. 60/949,230, filed Jul. 11, 2007, entitled "Integrated Modulating Retro-Reflector," the entirety of which is herein incorporated by reference for all purposes.

This application is a non-provisional, and claims the benefit, of commonly assigned U.S. Provisional Patent Application No. 60/949,200, filed Jul. 11, 2007, entitled "Flip Chip Photo-Diode," the entirety of which is herein incorporated by reference for all purposes.

STATEMENT AS TO RIGHTS TO INVENTIONS MADE UNDER FEDERALLY SPONSORED RESEARCH OR DEVELOPMENT

This invention was supported by U.S. Government under an award by Special Operations Command under Contract No. H92222-04-C-0004, which outlines certain rights in the invention given to the U.S. Government.

BACKGROUND

This disclosure relates to quantum well modulators.

Interrogators often employ modulators and/or reflectors to respond to an interrogating beam of light. The modulator adds a signal to a reflected beam of light, and the reflector directs the interrogating beam of light back toward the light source. Modulating retro reflectors, in general, are becoming smaller, lighter and faster. High data rates can be achieved with fast modulators.

BRIEF SUMMARY

A quantum well modulator configured to absorb or transmit light depending on an applied voltage is provided according to one embodiment. The quantum well modulator may include a substrate, a p-type semiconductor, a quantum well layer, and an n-type semiconductor, each of which is deposited above the substrate. The flip-chip quantum well modulator may be configured to substantially absorb light received through the substrate when a first voltage is applied. The flip-chip quantum well modulator is configured to substantially transmit light received through the substrate when a second voltage is applied. The first voltage or second voltage may include any voltage including zero volt. A plurality of interconnects, such as conductive epoxy bumps, may be coupled with the p-type and/or n-type semiconductor layers.

A flip-chip quantum well modulator is provided according to some embodiments. The flip-chip quantum well modulator may be configured to absorb or transmit light depending on an applied voltage. The quantum well modulator may include a substrate, a p-type semiconductor, a quantum well layer, and an n-type semiconductor, each of which is deposited above the substrate. In some embodiments, the substrate may be configured to filter light incident thereon and/or the substrate does not include a reflective surface. The flip-chip quantum well modulator is configured to substantially transmit light received through the substrate when a second voltage is applied. The first voltage or second voltage may include any voltage including zero volt. A plurality of interconnects, such as conductive epoxy bumps, may be coupled with the p-type and/or n-type semiconductor layers.

Another quantum well modulator is provided that includes a top surface and a bottom surface according to some embodiments. The quantum well modulator includes a substrate, an active area, and a plurality contacts. In some embodiments, the plurality of contacts and the active area disposed on the bottom surface of the quantum well modulator and at least a portion of the substrate is disposed on the top surface of the quantum well modulator. In some embodiments the substrate is configured to transmit at least infrared light.

In the appended figures, similar components and/or features may have the same reference label. Where the reference label is used in the specification, the description is applicable to any one of the similar components having the same reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

A flip chip quantum well modulator is provided according to some embodiments described herein. In one embodiment, a quantum well modulator may include an active area and a substrate. The active area may include various layers of doped and/or undoped semiconductor materials, include p-type semiconductor layers and n-type semiconductor layers. These layers are deposited on the surface of the substrate. A voltage may be applied that changes the light absorption of the active area. The substrate may be used as a light band filter, for example, filtering visible light from transmitting into the active area. Moreover, light entering the active layers, in some embodiments, must first pass through the substrate. The quantum well modulator may also include a ball grid array of conductive epoxy bumps. Some of the balls may be communicatively coupled with a p-type semiconductor layer, and other balls may be communicatively coupled with an n-type semiconductor layer.

Quantum well modulators used in optical switching take advantage of the electroabsorption effect in devices that operate on very small time scales, for example, on the order of picoseconds or less. When an applied electric field is applied across an active region of a quantum well modulator, absorption for photon energies increases just below the band gap by the Stark effect. As the electric field is increased further, the band edge shifts to lower photon energies. By carefully controlling an applied voltage, and therefore electric field, optical properties of the device can be changed at will. An optical signal with photon energy just below the band gap of the quantum well modulator can be absorbed or transmitted with just a small change in the applied voltage. Thus, the quantum well modulator may be used as a fast acting optical switch.

Figure 1A:
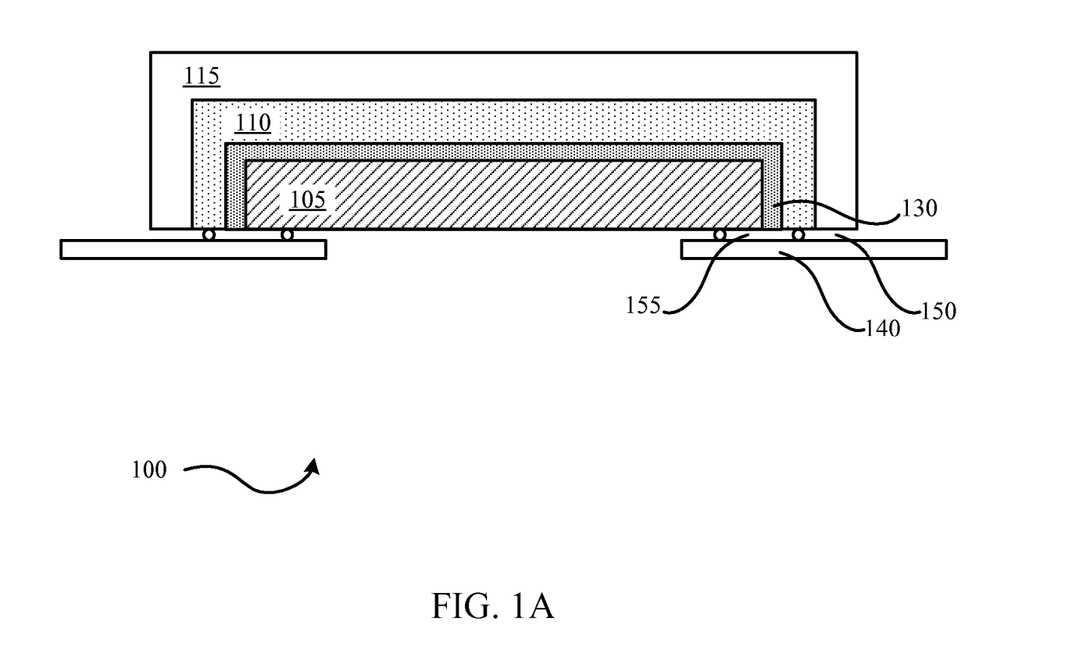
FIGS. 1A and 1B shows a side view of a quantum well modulator according to one embodiment.

FIG. 1A shows a side view of a quantum well modulator 100 according to one embodiment. The quantum well modulator 100 includes a number of layers deposited on a substrate 115. In some embodiments, the layers may be deposited using, for example, molecular beam epitaxy or metal oxide chemical vapor deposition. Various other deposition techniques may be used. The layers may include an n-type semiconductor layer 105, a quantum well layer 130, and a p-type semiconductor layer 110 deposited on the substrate 115. The n-type semiconductor layer 105, the quantum well layer 130, and the p-type semiconductor layer 110 incorporate the active area of the quantum well modulator. In other embodiments, the p-type and n-type semiconductors are switched.

The p-type semiconductor 110 may be a doped material that comprises one of the following materials gallium arsenide, aluminum gallium arsenide, indium gallium arsenide, silicon, germanium, and lead sulfide. The n-type semiconductor 105 may be a doped material that comprises one of the following materials gallium arsenide, aluminum gallium arsenide, indium gallium arsenide, silicon, germanium, and lead sulfide. The quantum well layer 130 may be an undoped semiconductor material, such as, gallium arsenide, aluminum gallium arsenide, indium gallium arsenide, silicon, germanium, and lead sulfide.

Various other layers may also be included. For example, a barrier layer, a contact layer, an etch stop layer, a spacer layer, a buffer layer, a cap layer, etc., may be included. Moreover, the layers may be deposited directly on the substrate 115 or on an intermediate layer between the substrate and the active layers. Moreover, the substrate 115 may be configured in any shape. For example, the substrate 115 is not necessarily U-shaped as shown in the figure.

Various embodiments disclosed herein do not include a reflective layer on the back side of the substrate. For example, the substrate does not include a layer of gold or other reflective material. It is notable that the substrate, in some embodiments, is meant to pass light within a specific bandwidth. The substrate 115 acts as an optical filter. The substrate may block visible sun light in one embodiment. In another embodiment, the substrate allows light with a wavelength between about 1530 nm and about 1560 nm to transmit into the active area. In another embodiment, the substrate 115 allows light with a wavelength in the infrared to pass through to the active area. In some embodiments, the substrate 115 comprises a silicon material.

The quantum well modulator 100 may also comprise a surface mount package. As shown in the figure, a plurality of solder balls 150, 155 are included. While solder balls are shown, any type of interconnect may be used, for example, conductive epoxy bumps. A subset of the plurality of solder balls 150, 155 are coupled with the p-type semiconductor 105, and a subset of the plurality of solder balls 150, 155 are coupled with the n-type semiconductor 110. These solder balls 150, 155 may also be coupled with a printed circuit board 140.

Figure 1B:
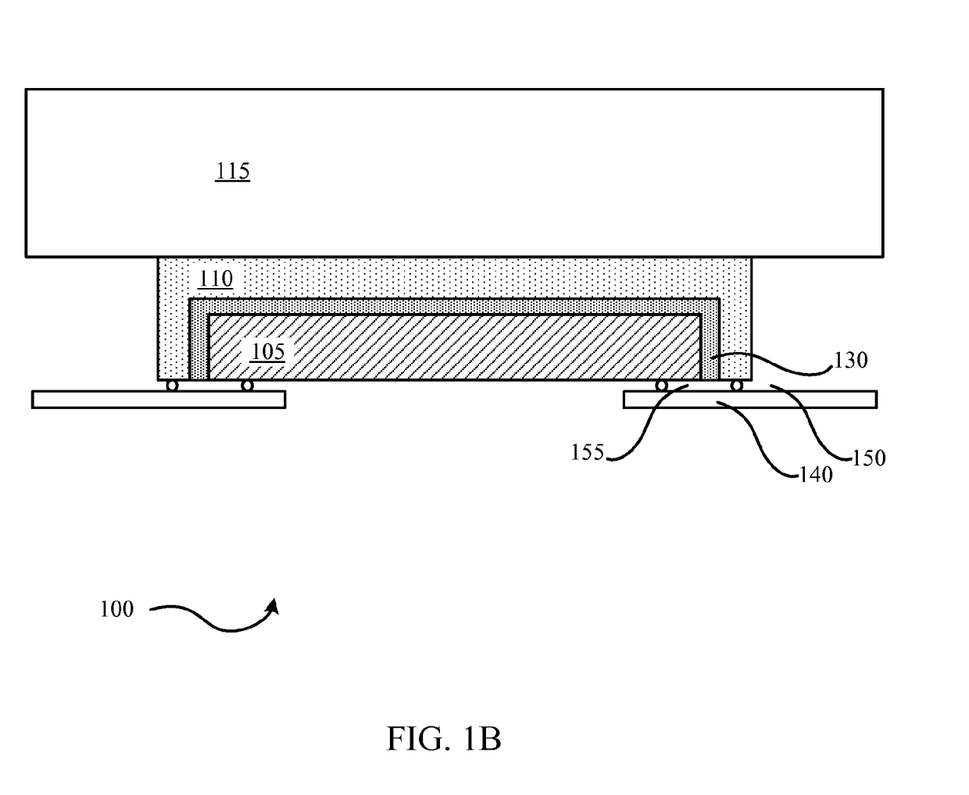

FIG. 1B shows another embodiment of a quantum well modulator 100. In this embodiment, the active area, which includes the p-type semiconductor 110, the n-type semiconductor 105 and the quantum well layer 130 may be included in a mesa type structure as shown.

Figure 2:
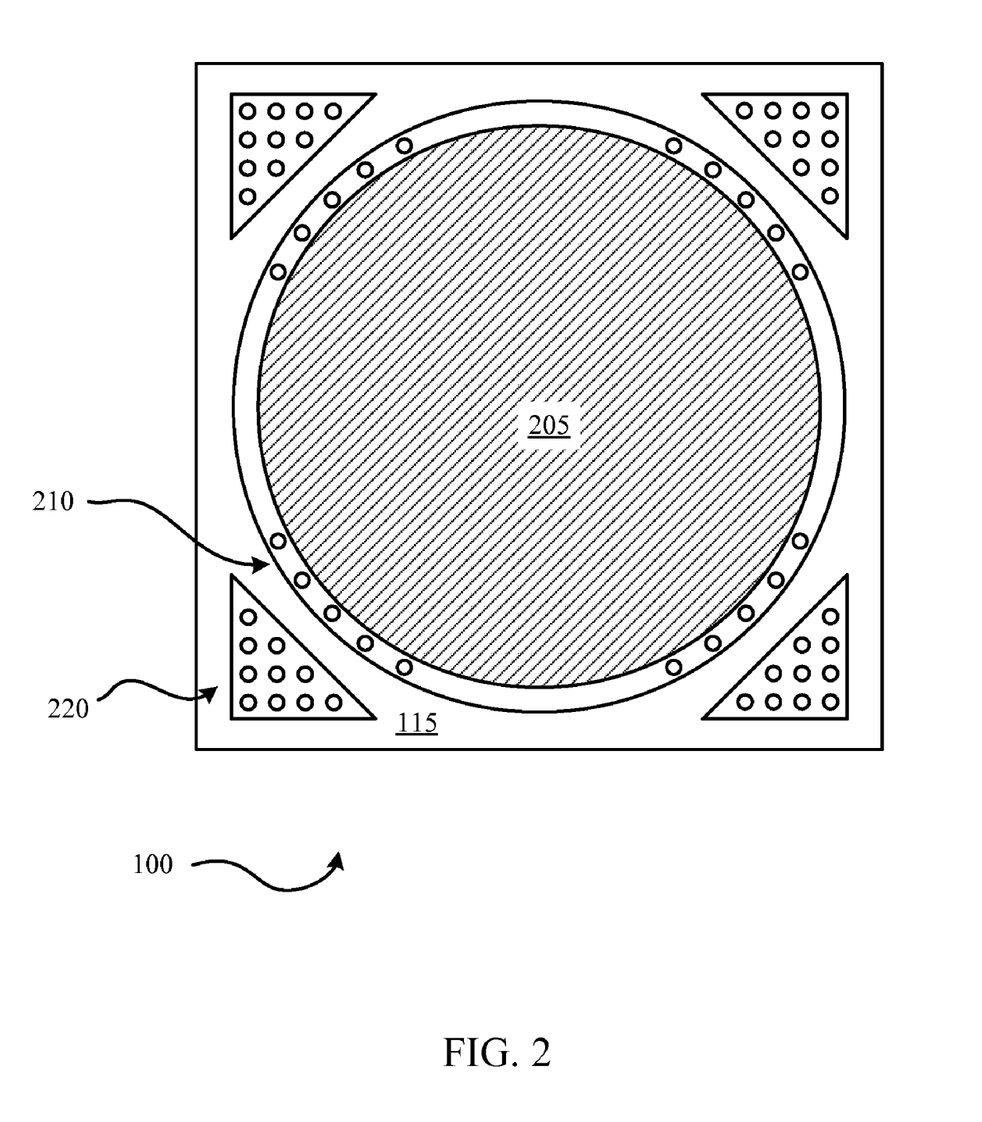
FIG. 2 shows a top view of a quantum well modulator according to one embodiment.

FIG. 2 shows a top view of a quantum well modulator 100 according to another embodiment. The quantum well modulator 100 includes an active area 205 exposed within the center of the quantum well modulator 100. As shown, the active area 205 is circular. Moreover, the active area 205 does not include a grid. Prior quantum well modulators include a grid on the active side. Contact bumps 210, 220 are shown. For example, either of the contact bumps 210, 220 may be coupled with either the p-type semiconductor or the n-type semiconductor. Moreover, the contact bumps 210, 220 may be located on the exterior of a window. The window, in some embodiments, may pass light within a specific wavelength. Moreover, the window may include the active region 205. The substrate may be chosen, in some embodiments, depending on the wavelengths of light one chooses to pass. The contact bumps 210, 220 may be placed within portions of the substrate.

Figure 3:
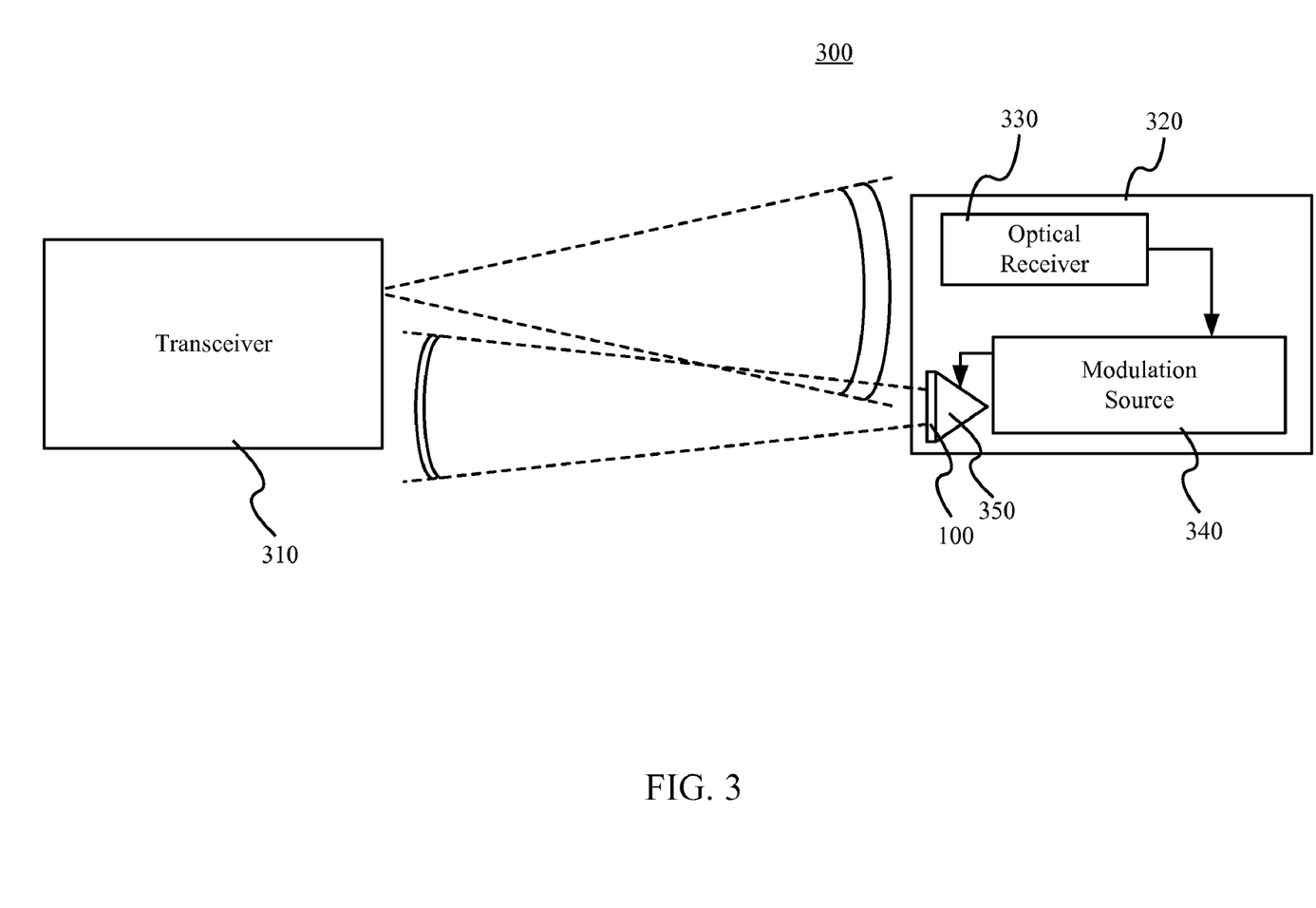
FIG. 3 shows a communication system that may implement a quantum well modulator according to some embodiments.

FIG. 3 shows an optical communication system 300 employing a quantum well modulator according to one embodiment. As shown, transceiver 310 transmits an information bearing optical signal toward an optical tag 320. An optical receiver 330 may be disposed within the optical tag 320 and receives the signal. The optical receiver 330 may include a flip chip photodiode and may be coupled with a modulation source 340 which may modify or add information to the signal. An output of modulation source 340 is coupled to a reflector 350 for transmission. The reflector 350 may include a retro reflector. In some embodiments, the reflector 350 may include a quantum well modulator 100 coupled thereto. The quantum well modulator may provide modulation to a return signal. In this manner, transceiver 310 and optical tag 320 communicate.

Figure 4A:
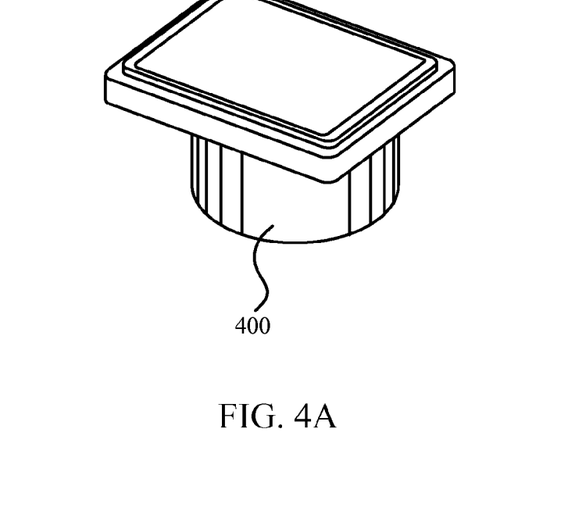
FIGS. 4A and 4B show a flip-chip photodiode used in conjunction with an optical communication device according to one embodiment.
Figure 4B:
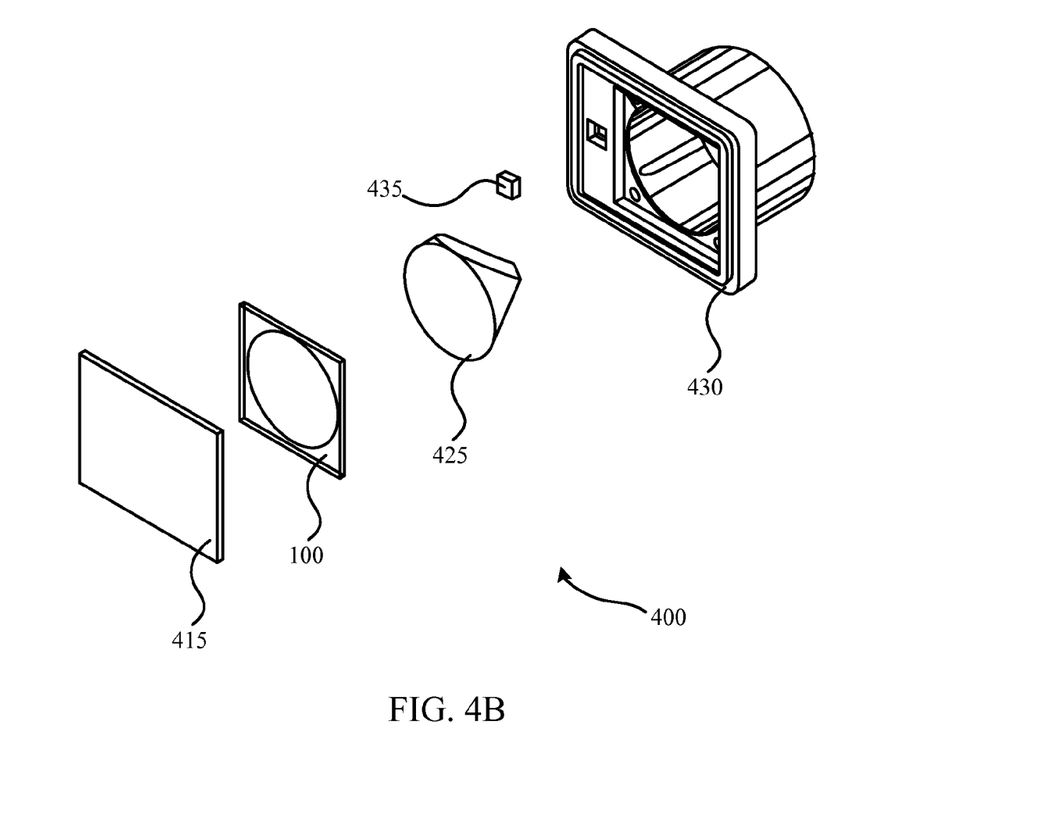

FIG. 4B shows an exploded view of an optical communication device 400 that includes a flip-chip photodiode 435 according to one embodiment. A housing 430 contains a retro reflector 425, a quantum well modulator 100, a window 415 and a photodiode 435. The quantum well modulator 420 may modify or add information to the signal before and/or after reflection through the retro reflector 425. FIG. 4A shows an unexploded packaged view of the optical communication device 400.

In one embodiment, the present disclosure uses a flip-chip assembly including a photo-diode and quantum well optical modulator. One application would be an optical tag having a quantum well optical modulator, a retro-reflector and an optical window. The active area of the quantum well modulator is facing downward or toward the printed circuit board (PCB). Solder pads or bumps couple the quantum well modulator to the board. These flip-chip quantum well modulators can be used for optical laser communication applications, for example, in the Dynamic Optical Tags System (DOTS) or as Optical Combat Identification tags.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While the principles of the disclosure have been described above in connection with specific apparatuses and methods, it is to be clearly understood that this description is made only by way of example and not as limitation on the scope of the disclosure.

What is claimed is:

1. A flip-chip quantum well modulator configured to absorb or transmit light depending on an applied voltage, the quantum well modulator comprising:
   a substrate configured to filter light incident thereon, wherein the substrate does not include a reflective surface, wherein the filtered light is within a specific wavelength band;
   a p-type semiconductor layer deposited above the substrate;
   a quantum well layer deposited above the substrate; and
   an n-type semiconductor layer deposited above the substrate;
   wherein the flip-chip quantum well modulator is configured to substantially absorb light received through the substrate when a first voltage is applied; and
   wherein the flip-chip quantum well modulator is configured to substantially transmit light received through the substrate when a second voltage is applied.

2. The flip-chip quantum well modulator according to claim 1, further comprising a plurality of solder balls communicatively coupled with the p-type semiconductor layer.

3. The flip-chip quantum well modulator according to claim 1, further comprising a plurality of solder balls communicatively coupled with the n-type semiconductor layer.

4. The flip-chip quantum well modulator according to claim 1, further comprising a plurality of conductive epoxy bumps communicatively coupled with the p-type semiconductor layer.

5. The flip-chip quantum well modulator according to claim 1, further comprising a plurality of conductive epoxy bumps communicatively coupled with the n-type semiconductor layer.

6. The flip-chip quantum well modulator according to claim 1, wherein the p-type semiconductor comprises a material selected from the group consisting of gallium arsenide, aluminum gallium arsenide, indium gallium arsenide, silicon, germanium, and lead sulfide.

7. The flip-chip quantum well modulator according to claim 1, wherein the n-type semiconductor comprises a material selected from the group consisting of gallium arsenide, aluminum gallium arsenide, indium gallium arsenide, silicon, germanium, and lead sulfide.

8. The flip-chip quantum well modulator according to claim 1, wherein the substrate comprises silicon.

9. The flip-chip quantum well modulator according to claim 1, wherein the substrate comprises indium phosphide.

10. The flip-chip quantum well modulator according to claim 1, wherein the specific wavelength band comprises 1530 nm to 1560 nm.

11. The flip-chip quantum well modulator according to claim 1, wherein the substrate filters visible sunlight.

12. The flip-chip quantum well modulator according to claim 1, wherein the substrate filters light such that infrared light is allowed to pass through the substrate.

13. A flip-chip quantum well modulator configured to absorb or transmit light depending on an applied voltage, the flip-chip quantum well modulator comprising:
   a substrate configured to filter light incident thereon, wherein the substrate does not include a reflective surface, wherein the filtered light is within a specific wavelength band;
   a p-type semiconductor layer deposited above the substrate;
   a quantum well layer deposited above the substrate; and
   an n-type semiconductor layer deposited above the substrate;
   wherein the flip-chip quantum well modulator is configured to substantially absorb light received through the substrate when a first voltage is applied; and
   wherein the flip-chip quantum well modulator is configured to substantially transmit light received through the substrate when a second voltage is applied.

14. The flip-chip quantum well modulator according to claim 13, further comprising a plurality of interconnects coupled with the p-type semiconductor.

15. The flip-chip quantum well modulator according to claim 13, further comprising a plurality of interconnects coupled with the n-type semiconductor.

* * * * *

UNITED STATES PATENT AND TRADEMARK OFFICE
CERTIFICATE OF CORRECTION

PATENT NO. : 7,679,805 B2
APPLICATION NO. : 12/171803
DATED : March 16, 2010
INVENTOR(S) : Mahyar Dadkhah et al.

It is certified that error appears in the above-identified patent and that said Letters Patent is hereby corrected as shown below:

Column 1, Line 55, delete "volt" and insert -- volts --

Column 2, Line 3, delete "volt" and insert -- volts --

Column 3, Line 44, delete "substrate" and insert -- substrate 115 --

Signed and Sealed this

Eighteenth Day of May, 2010

David J. Kappos
*Director of the United States Patent and Trademark Office*